(12) United States Patent
Berndt et al.

(10) Patent No.: US 7,976,940 B2
(45) Date of Patent: Jul. 12, 2011

(54) COMPONENT, METHOD FOR COATING A COMPONENT, AND POWDER

(75) Inventors: Thomas Berndt, Berlin (DE); Nigel-Philip Cox, Mülheim an der Ruhr (DE); Andreas Griep, Berlin (DE); Guido Kern, Berlin (DE); Gerhard Reich, Berlin (DE); Peter Sindlhauser, Dietmannsried (DE)

(73) Assignee: Siemens Aktiengesellschaft, Munich (DE)

( * ) Notice: Subject to any disclaimer, the term of this patent is extended or adjusted under 35 U.S.C. 154(b) by 75 days.

(21) Appl. No.: 11/274,669

(22) Filed: Nov. 15, 2005

(65) Prior Publication Data

US 2006/0105160 A1  May 18, 2006

Related U.S. Application Data

(63) Continuation-in-part of application No. 10/820,483, filed on Apr. 8, 2004, now abandoned, which is a continuation-in-part of application No. 10/667,266, filed as application No. PCT/EP03/02977 on Mar. 21, 2003, now abandoned.

(30) Foreign Application Priority Data

Apr. 10, 2002 (EP) .................................. 02008044
Aug. 28, 2003 (EP) .................................. 03019470
Oct. 24, 2003 (EP) .................................. 03024366

(51) Int. Cl.
*B32B 9/00* (2006.01)
*B32B 18/00* (2006.01)

(52) U.S. Cl. ............ 428/325; 428/32.35; 428/32.5; 428/32.71; 428/40.2; 428/40.4; 428/41.7; 428/206; 428/334; 427/375; 427/376.1; 427/376.2

(58) Field of Classification Search .............. 428/209, 428/320.1, 32, 35, 5, 71, 40.2, 40.4, 41.7, 428/206, 325, 334–336; 427/375, 376.1, 427/376.2
See application file for complete search history.

(56) References Cited

U.S. PATENT DOCUMENTS

| | | | | |
|---|---|---|---|---|
| 4,128,522 A | * | 12/1978 | Elam | 524/365 |
| 4,617,202 A | * | 10/1986 | Baldi | 427/253 |
| 4,726,104 A | * | 2/1988 | Foster et al. | 29/889.1 |
| 4,885,264 A | * | 12/1989 | Sindlhauser et al. | 501/87 |
| 5,985,368 A | | 11/1999 | Sangeeta et al. | |
| 6,036,995 A | | 3/2000 | Kircher et al. | |
| 6,054,673 A | | 4/2000 | Chen | |
| 6,172,331 B1 | | 1/2001 | Chen | |
| 6,283,714 B1 | | 9/2001 | Rigney et al. | |
| 6,521,294 B2 | * | 2/2003 | Rigney et al. | 427/253 |
| 6,623,790 B2 | * | 9/2003 | Fernihough et al. | 427/140 |

FOREIGN PATENT DOCUMENTS

| | | |
|---|---|---|
| DE | 100 63 309 A1 | 7/2002 |
| GB | 2 210 387 A | 6/1989 |
| JP | 11181561 A | 7/1999 |

* cited by examiner

*Primary Examiner* — Cathy Lam

(57) ABSTRACT

Coatings which are applied to a component have to be removed again in a complex way in certain regions, since a coating was not desired to be present in those regions. The subsequent removal of this layer adversely affects the component, for example its geometry. The method according to the invention for coating a component includes a masking which at least partially comprises a ceramic powder and can therefore easily be removed after the component has been coated.

10 Claims, 7 Drawing Sheets

COMPONENT, METHOD FOR COATING A COMPONENT, AND POWDER

CROSS REFERENCE TO RELATED APPLICATIONS

This application is a continuation-in-part application of continuation in part application Ser. No. 10/820,483, filed Apr. 8, 2004 now abandoned, which is a continuation-in-part application of U.S. patent application Ser. No. 10/667,266, filed Sep. 19, 2003 now abandoned, which is the US National Stage of International Application No. PCT/EP03/02977, filed Mar. 21, 2003, which claims the benefits of European application No. 02008044.6 EP, filed Apr. 10, 2002 under the European Patent Convention. This continuation-in-part application also claims the benefits of European application No. 03019470.8 EP, filed Aug. 28, 2003 under the European Patent Convention. This continuation-in-part application also claims the benefits of European application No. 03024366.1, filed Oct. 24, 2003 under the European Patent Convention, which claims the benefits of the European application No. 03019470.8 EP. Each of the above-referenced applications are incorporated by reference herein by their entirety.

FIELD OF INVENTION

The invention relates to a method for coating a component in accordance with the preamble of the claims and a method for drilling a hole into a component in accordance with the claims.

BACKGROUND OF INVENTION

When components are being coated, it is not always the case that the entire outer or inner surface of a component is to be coated. This is true of all coating processes, such as for example plasma spraying, PVD (physical vapor deposition) or CVD (chemical vapor deposition) processes.

Parts of the coating where coating was not desired have to be removed. This often has to be done by abrasive removal of the coating in these regions, since the material of the coating bonds very firmly to the component or even reacts therewith if, for example, the component has been coated with aluminium in order to carry out alitizing.

However, the abrasive removal of coating material often leads to a certain amount of damage to the component or to a certain change in its geometry. This is the case, for example, with sand-blasting, in which the sand particles remove, for example, parts of an aluminium coating from the component.

U.S. Pat. No. 6,036,995 demonstrates the need for masking by adhesive tapes, metal foils in order to cover surface regions which are not to be coated. The coating is carried out by application of slurry. Metal foils do not bond securely to bases and therefore offer only insufficient protection, for example in an evaporation-coating installation in which the particles which are to be applied move in all directions (and thereby migrate beneath the foil).

Adhesive tapes are unable to withstand high temperatures.

In U.S. Pat. No. 5,985,368, coating is carried out using a ceramic slurry. No masking takes place.

U.S. Pat. No. 6,283,714 demonstrates the need for masking for coatings comprising aluminium. However, a specific arrangement inside the coating installation prevents aluminium from being deposited on the undesired locations.

GB 2 210 387 a describes a mask being applied by means of a slurry or paste containing a binder.

JP 11 181 561 discloses a masking, the masking consisting of an organic solvent, an organic binder and a powder.

This is a general procedure. Powder with binder in a carrier medium is applied to a component. The binder holds the powder together, is burnt out after the application and evaporation of the carrier medium and the powder is sintered so that it remains stable.

Components as described above are not only coated, but also provided with holes. Particularly turbine blades or vanes of gas turbines comprise film cooling holes whereby cooling air introduced into the blade or vane can exhaust and therefore cool the blade or vane.

Such holes are drilled into the blades by irradiating the surface of the component with an energy beam like laser beam. DE 100 63 309 A1, U.S. Pat. No. 6,054,673 and U.S. Pat. No. 6,172,331 B1 demonstrate examples of methods for drilling holes into turbine blades. However, it was detected, that the drilling operation is accompanied by deposition of material melted by the energy beam onto the surface of the component particularly adjacent to the hole. Hence, it is necessary to remove this material from the surface by an additional method step which is expensive and might destroy the coating locally.

SUMMARY OF INVENTION

Therefore, it is an object of the invention to provide a component which is not coated in the undesired regions as a result of the use of masking, it being possible for the masking to be removed again in a simple way after the coating has been carried out.

The object is achieved by a component as claimed in the claims. The surface is protected only by powder or a powder layer in the regions of the component in which coating is not desired.

No binder is used during the application of the masking layer to the component, the masking layer consisting only of powder. The other object is achieved by a process as claimed in the claims wherein the surface of the component is protected at least in regions, which are not to be drilled, with a layer formed by a powder so that material melted by the energy beam deposits onto the layer and can easily be removed together with the layer. Since the presence of the powder layer does not trouble the drilling operation, the entire surface of the component can be coated with the powder layer as far as it is necessary.

The dependent claims list further advantageous improvements to the component described in the claims.

The measures listed in the subclaims can advantageously be combined with one another.

To form a masking or layer, the powder has to be applied to the component in a first process step.

The masking or layer comprising powder can advantageously be applied to the component by means of a suspension, in which case the suspension also does not contain any binder, but rather consists only of the powder and a carrier medium which can easily be evaporated but does not, in the manner of a binder, improve the adhesion of the grains of the powder to one another.

It is particularly advantageous if the suspension consists of water and a ceramic powder, since water is an optimum carrier medium and is not harmful to health.

In this context, it is also particularly advantageous to use oxide ceramics which do not oxidize in the water. Zirconium oxide is used in particular.

Zirconium oxide also has numerous advantages for masking on metallic substrates, since any impurities caused by zirconium diffusing into the substrate have no adverse effect on the mechanical properties of the substrate. On the contrary, zirconium oxide is often added to an alloy as a desired additional constituent.

Good powder coating is achieved by the use of two powders which have different grain size distributions (coarse/fine).

Furthermore, it is an object of the invention to provide a component in which holes are to be drilled. The component has a layer formed by a powder which might not be restricted to the regions to be drilled.

The masking or layer advantageously does not contain any binder.

If appropriate, a binder is not used during application of the masking or layer.

The subclaims list further advantageous improvements to the components described in the claims.

The measures listed in the subclaims can advantageously be combined with one another.

BRIEF DESCRIPTION OF THE DRAWINGS

Exemplary embodiments are explained in the following figures, in which.

DETAILED DESCRIPTION OF INVENTION

Figure 1:
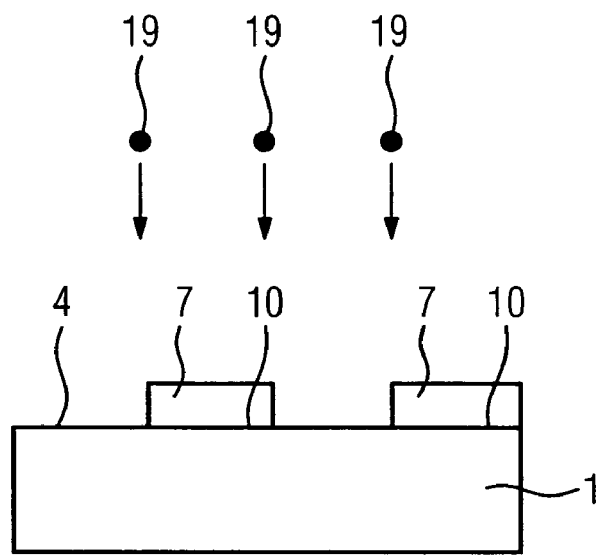
FIG. 1 shows a process step of the process according to the invention applied to a component.

FIG. 1 shows a component 1, in particular a turbine blade or vane 120, 130 (FIG. 11), combustion chamber part 153, 155 (FIG. 10) or a housing part of a gas turbine 100 or steam turbine, for example consisting of an iron-base, nickel-base or cobalt-base superalloy, which has a surface 4. The nickel-base or cobalt-base superalloy may also contain small quantities of zirconium as an alloying constituent.

The surface 4 of the component 1 is to be coated with a ceramic or metallic coating material 19, such as for example aluminium, with the coating being applied in particular from a vapor phase.

There are regions 10 in which a coating 13 comprising the coating material 19 is not desired, such as for example a blade or vane root 183 (FIG. 9) of a turbine blade or vane 120, 130.

These regions 10 are protected by a masking 7 which is formed as a powder layer 7 on the component 1, 120, 130, 153, 155.

The powder has to be applied to the component 1. The masking 7 is applied to the regions 10, by way of example in the form of a suspension (which is explained as an example in the text which follows), a slurry or a paste of a powder without binder, a component which is used in accordance with the prior art in order to hold a powder layer (green layer) together.

During the coating of the component 1, 120, 130, 153, 155, the masking 7 continues to adhere to the component 1, 120, 130, 153, 155.

The suspension consists only of a liquid carrier medium and the powder.

Examples of suitable carrier media include alcohols and in particular water. Water is not volatilized as quickly during application of the suspension, so that the drying behaviour can be adjusted and controlled, and moreover it does not constitute a hazardous working medium.

In this case, it is advantageous to use 30% by weight to 50% by weight, in particular 40% by weight, of water and 50% by weight to 70% by weight, in particular 60% by weight, of powder.

The suspension is continuously mixed by stirring or other agitation during the application process of the masking 7 as a result of a very high introduction of kinetic energy, in particular by means of a dissolver, so that the powder does not settle in the suspension and/or agglomerates of powder grains are broken up and new agglomerates are not formed. A suitable jet-mixing head which has a vertical flow and high rotational speeds of up to 10,000 rpm, is used for the application.

If appropriate, the carrier medium may contain stabilizers, but these are volatilized or evaporated with the carrier medium after the suspension has been applied.

The masking 7 can also be applied to the component 1, 120, 130, 153, 155 in the regions 10 by the component 1, 120, 130, 153, 155 being immersed in the suspension, by brushing, by being sprayed on or by other forms of application. Spraying of the suspension is a particularly suitable option.

This preferably results in a thickness of 100 to 400 micrometers (μm), in particular 180 to 200 micrometers, for the masking 7.

The application may be local or over a large area. Since this spraying operation takes place at room temperature, the other regions 25, i.e. those regions which are subsequently to be provided with a coating 13, can be covered, for example, by adhesive tape which can be removed easily and without leaving residues.

The carrier medium volatilizes or evaporates. The masking 7 can be slightly heated for this purpose.

The powder layer (masking 7) should form an impervious surface, such that it is impossible for any material 19, in particular metal or ceramic vapor during subsequent coating, to penetrate through the masking 7 to reach the surface 4 in the regions 10.

The powder used for the masking 7 can be selected in such a way that the material 19 of the subsequent coating 13 rolls off the powder on account of its surface properties (roughness, etc.), so that it is impossible for any material 19 of the subsequent coating 13 to penetrate through the masking 7.

The powder of the masking 7 can also be selected in such a way that the material 19 of the subsequent coating adheres particularly well to the powder, so that any small pores or cracks which may be present in the masking 7 are closed up and the material 19 of the subsequent coating 13 is prevented from penetrating through the masking 7.

Suitable selection of a grain size distribution for the powder results in the desired properties of sufficiently strong bonding of the powder layer to the substrate and the formation of a sufficiently impervious surface.

Figure 7:
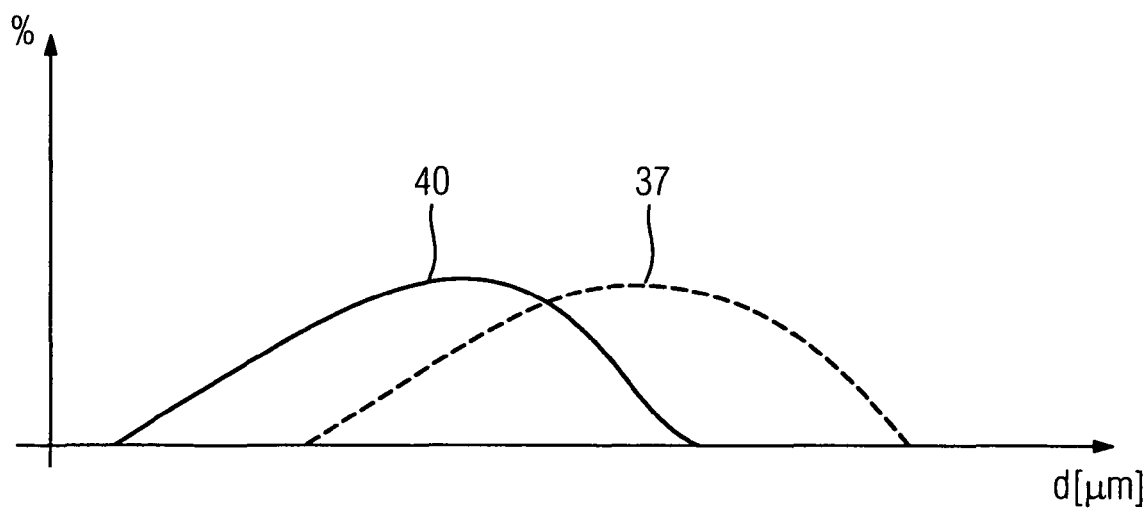
FIG. 7 shows properties of the powder used.

During production of the powder, a specific grain size distribution results for the material of the powder and the method of production. FIG. 7 shows one such grain size distribution of a powder (37, 40), plotting the frequency of the grain size d(μm).

Expedient mean grain distributions are in the following ranges:

$d_{10}$=0.1 μm to 6 μm, in particular 0.2 μm to 1 μm,
$d_{50}$=1 μm to 15 μm, in particular 3 μm to 6 μm, and
$d_{90}$=6 μm to 40 μm, in particular 15 μm to 25 μm.

The starting range and/or the end range of the grain size distribution can be screened out by screening.

For the masking 7, it is possible to use a powder which has the required grain size properties with the associated $d_{10}$, $d_{50}$ or $d_{90}$ values right from the outset.

Figure 8:
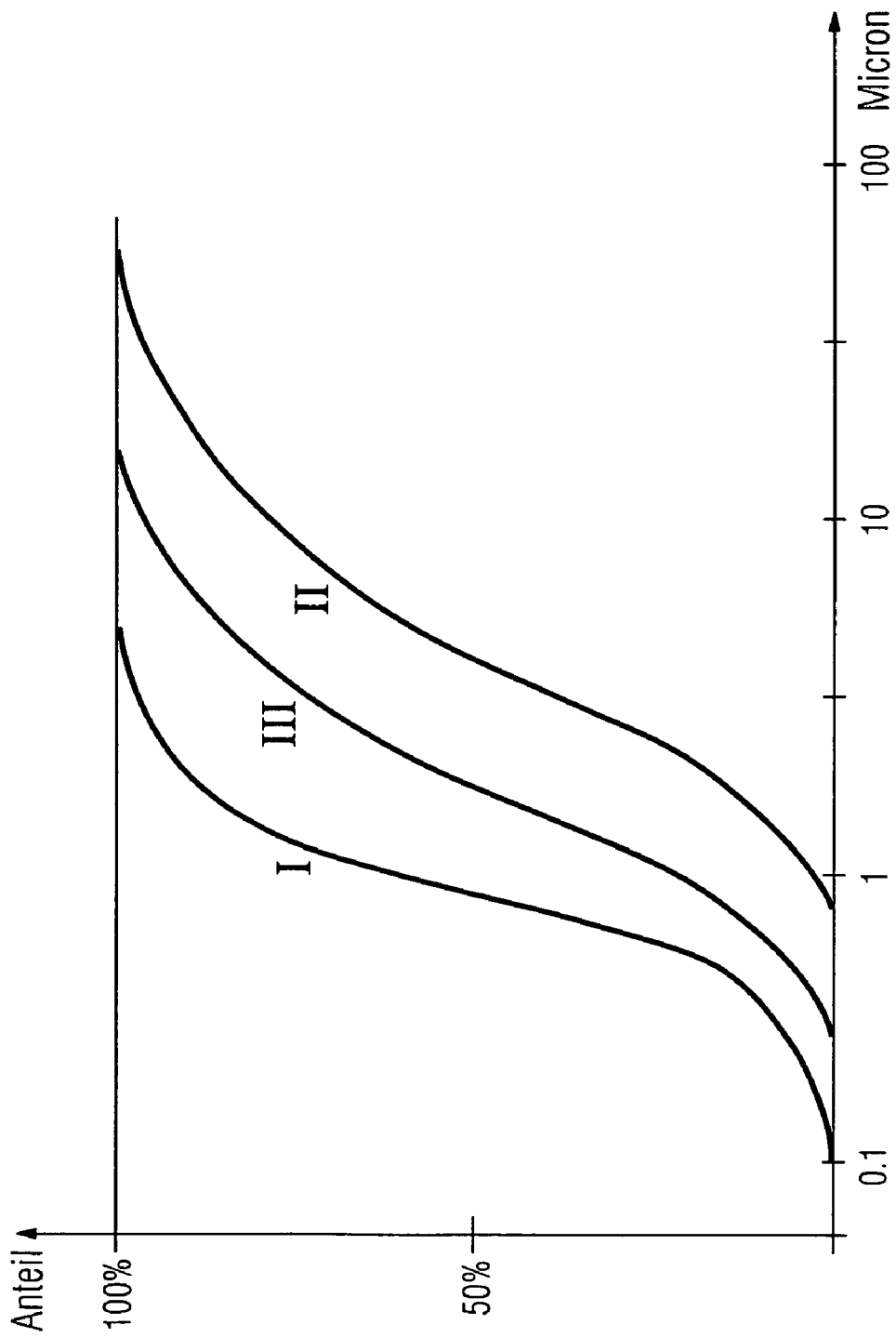
FIG. 8 shows grain size distribution curves of a powder mixture and of the starting powders.

However, it is also possible to use a powder mixture, i.e. various powders 37, 40, i.e. various grain size distributions as shown in FIG. 7 or 8, are used for the masking 7.

In this case, by way of example, a coarse powder 37 and a fine powder 40 are mixed and used for the masking.

However, it is also possible to mix three, four or more powders.

The position of the grain size distributions of the powders 37, 40 in FIG. 7 is only diagrammatically indicated. In particular, the position of the overlap between the curves 37, 40 can be varied. In particular, by way of example, it is possible to recognise two maximums in the frequency of the grain size distribution of the powder or powder mixture, representing the coarse fraction 37 and the fine fraction 40.

The morphology of the grains of the fine powder 40 and of the coarse powder 37 may differ.

The morphology of the fine and coarse grains can be therefore the same or different.

In most cases blocky grains are used. But also grains in form of flakes (e.g. powder of carbon) are possible.

Other morphologies or any mixture of it can be used. Even both fine and coarse powder can have a different morphology, respectively.

Boron nitride (BN) is such a powder which shows grains in form of flakes, but boron nitride can also have blocky grains, which is often used.

FIG. 8 shows an example of a grain size distribution (micron=micrometer) of a powder mixture III which is used and of its starting powders I, II.

The powder mixture III is formed from a powder mixture I (=40) and II (=37) and has grain sizes of greater than 0.2 μm up to approximately less than 20 μm (factor of 100 between the smallest grain size and the largest grain size).

A specific fraction ratio of the powders I and II is set in order to achieve this grain size distribution. The powder I has grain sizes of approximately 0.1 μm to approximately 5 μm (factor of 50 between smallest grain size and largest grain size).

The powder II has grain sizes of approximately 0.8 μm to approximately 60 μm (factor of 75 between smallest grain size and largest grain size) and therefore has a shallower profile than the grain size distribution of the finer powder I.

In principle, of course, the grain sizes of the powder mixture III are between the smallest grain size and the largest grain size of powders I and II. The mixing and measurement accuracy used to determine the grain sizes mean that the lower and upper regions of the curve III are very low.

Figure 9:
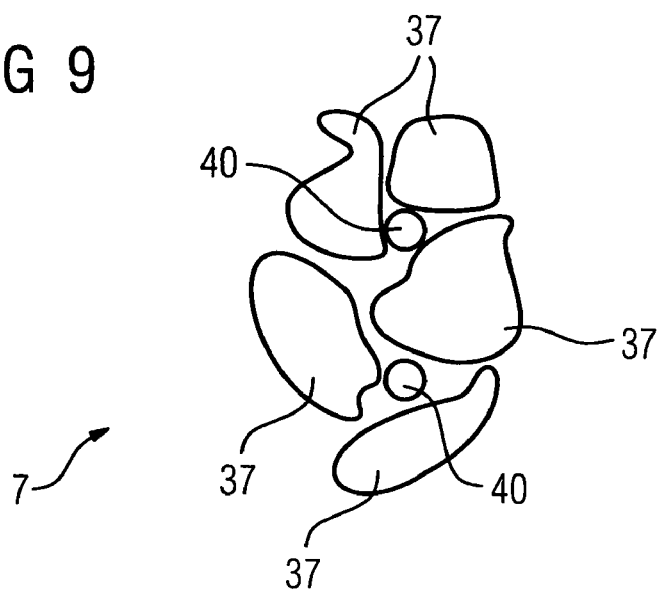
FIG. 9 shows an excerpt from a masking which consists of two powders, FIG. 10 show a component in accordance with the invention.

FIG. 9 shows an excerpt from a masking 7 which consists of two powders 37, 40 which have different grain size distributions (fine powder 40, coarse powder 37) in accordance with FIG. 7.

The masking 7 formed from a powder mixture of this type therefore has coarse powder grains 37 and smaller or fine powder grains 40.

In particular, the fine powder 40 is selected in such a way that the smaller or finer grains of the fine powder 40 are located in the spaces between the coarse particles 37. This results in a dense, i.e. sufficiently impervious surface in the masking 7 and/or a good strength of the masking 7.

In this case, 10% by weight to 30% by weight, in particular 15% by weight to 20% by weight, of fine powder 40 and 70% by weight to 90% by weight, in particular 80% by weight to 85% by weight, of coarse powder 37 are used.

The fine powder 40 leads to good bonding of the masking 7 on the component 1, since intermeshing causes the coarser powder particles to be better coupled to one another. The fine powder acts as a type of lubricant which replaces the binder.

Each powder, on account of its grain size (grain size distribution), has a sintering temperature at which considerable densification and fusing of the grains to one another take place.

The grain size of the coarse powder 37 can be selected in such a way that the sintering temperature of the coarse powder 37 is above the coating temperature for the coating 13. Since the fine powder 40 of the masking 7 tends to be located in the spaces between the coarse powder 37 and/or is not linked up to such an extent, little or no sintering of the fine powder 40 takes place. Therefore, the selection of the grain size for a powder for use at a predetermined coating temperature can be based primarily on the coarse powder 37.

The coating temperature for the coating 13 may of course be higher than the sintering temperature of the fine powder 40 and therefore between the sintering temperatures of the coarse powder 37 and the fine powder 40.

The coating temperature for the coating 13 may of course also be lower than the sintering temperature of the fine powder 40.

Sintering of the powder before coating (i.e. after the application of the masking layer 7 and evaporation of the carrier medium) and during the coating is not necessary.

However, sintering may be permitted during coating.

In the case of particularly large areas of the masking layer 7, at least partial sintering may be appropriate in order to improve the mechanical stability of the masking layer 7.

The powder for the masking 7 is selected in such a way that it does not react with the component 1.

This is the case when using zirconium oxide as powder and in particular aluminium as coating material 19. The grain size distributions or the powder or powders 37, 40 are also selected accordingly, i.e. they contain few if any powder particles which have a high specific surface area. This can be set by using a suitable morphology of the grains.

The powder used may be metallic or ceramic powder or a mixture thereof.

In this context, it is a condition that the powder, during the subsequent coating of the component 1, 120, 130, 153, 155, should not react with the component 1, 120, 130, 153, 155, should not unacceptably contaminate it and should not cause excessive bonding to the component 1, 120, 130, 153, 155.

Ceramic powder is most suitable, since ceramic is highly chemically stable at the standard temperatures used to coat the component with further layers.

Zirconium oxide (fully stabilized, partially stabilized or unstabilized) is particularly suitable for use as the powder.

In this case, the suspension used comprises 40% by weight of water and 60% by weight of zirconium oxide.

Other materials, such as aluminium oxide, mixtures of various ceramic powders, are also possible.

It is also possible to use metallic powders, mixtures of various metal powders and mixtures of ceramic and metallic powders.

Also boron nitride (BN) can be used depending on the coating temperature, because boron nitride is a very high temperature stable material compare to zirconium oxide. Zirconium oxide can decomposed and by this oxygen is generated which can oxidise the substrate in a undesirable manner.

Boron nitride is therefore preferably used during coating for components of gas turbine engines, because the oxidation of the substrate is not wanted.

The powder of the masking 7 can also be chosen in such a way that a bad or no wetting occurs between the powder and the material 19, which does not adhere to the masking powder.

Therefore the material of the masking should be chosen depending on the material 19 of the subsequent coating 13.

In case of coating the substrate 1 with aluminium boron nitride is also a good material because it shows no adherence of aluminium to the masking 7 and e.g. aluminium therefore forms droplets.

The coating of the component 1, 120, 130, 153, 155 consisting of the coating material 19 is, for example, applied by evaporation coating and is formed, for example, by a CVD (chemical vapor deposition) process or PVD (physical vapor deposition) process or plasma spraying.

This involves temperatures of up to 1200° C. (coating temperature).

Further forms of coating are conceivable.

It is also possible for two layers to be applied to the regions 25 and therefore to the masking, for example a metallic interlayer (MCrAlY) followed by a ceramic layer (thermal barrier coating).

The masking 7 and therefore the grain size distributions of the powders used is selected in such a way that little or no sintering takes place, since the masking 7 would otherwise be difficult to remove after coating. The grain size of the powder is defined accordingly. On account of its grain size (grain size distribution), each powder has a sintering temperature at which considerable densification takes place. The grain size of the powder is therefore selected in such a way that the sintering temperature is above the coating temperature.

The masking 7 is particularly suitable for evaporation coating processes, since the vapor phase does not cause excessively high levels of mechanical energy to be introduced onto the masking 7.

Figure 2:
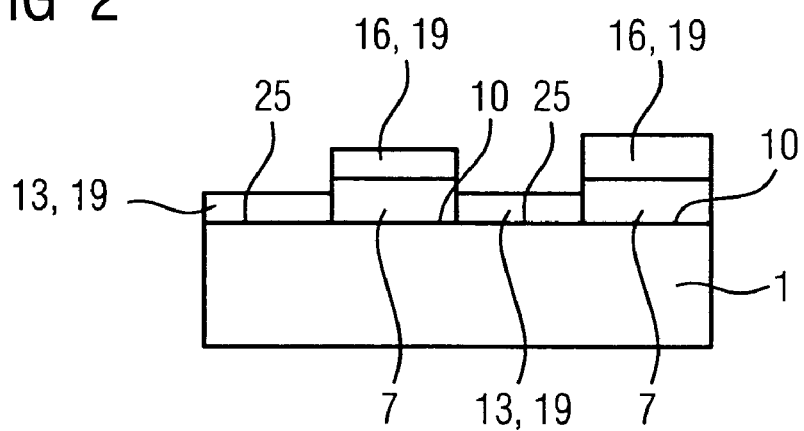
FIG. 2 shows an subsequent process step of the process according to the invention applied to a component.

FIG. 2 shows the component 1 which has been coated. There are regions 25 on the surface 4 with a coating 13 on the component 1 where this is desired. There is also a coating 16 on the masking 7.

Figure 3:
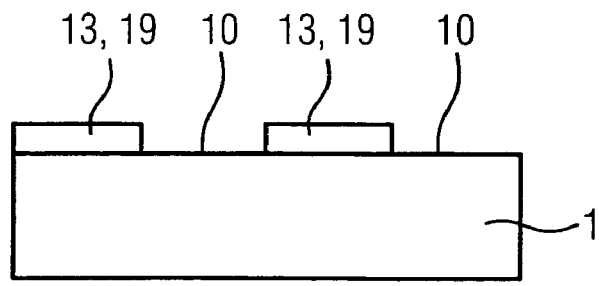
FIG. 3 shows another process step of the process according to the invention applied to a component.

Since the masking 7 can easily be removed, since it is merely attached to the component 1 by intermeshing and/or adhesion, the component 1, 120, 130, 153, 155 is not adversely effected at its surface 4 in the regions 10 in which coating was not desired (FIG. 3).

The masking 7 can be removed, for example, by being washed off, by blasting with dry ice, by being knocked off.

Figure 6:
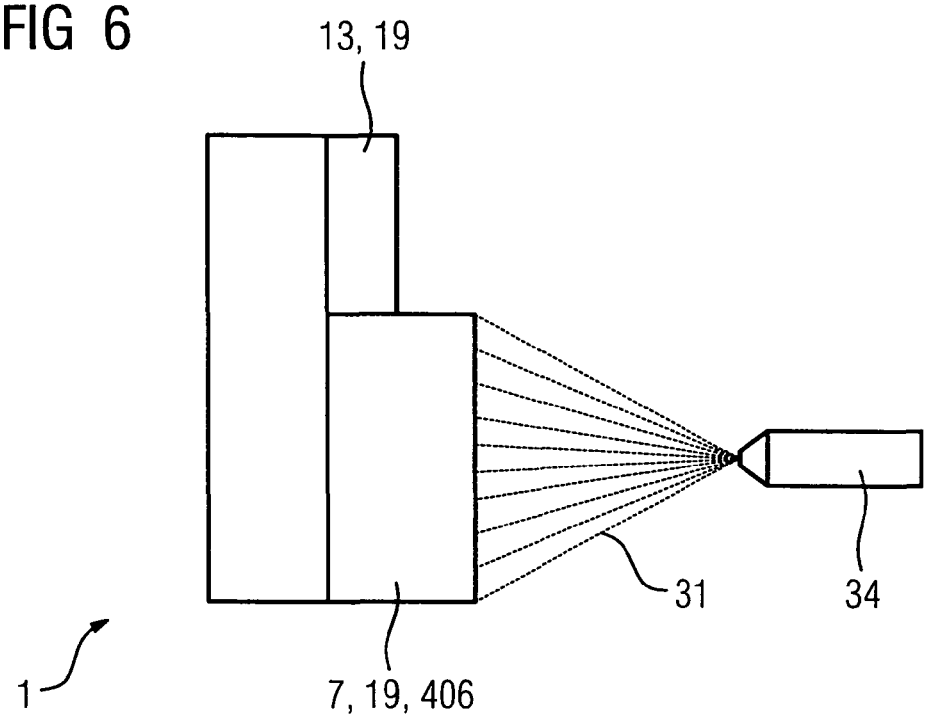
FIG. 6 shows another process step of the process according to the invention.

It is also possible to use a high-pressure water jet (up to 330 bar), in which case the water jet 31 (FIG. 6), by way of example, is widened in such a way that emerging from a nozzle 34 (FIG. 6) it impinges on a large area of the masking 7 which is to be removed, in particular the entire masking 7 (for example main blade part 406) and the jet does not have to be guided over the masking 7 which is to be removed.

For this purpose, the water jet 31 is widened appropriately. By way of example, it covers a complete side of the outer main blade surface of a turbine blade or vane.

Figure 4:
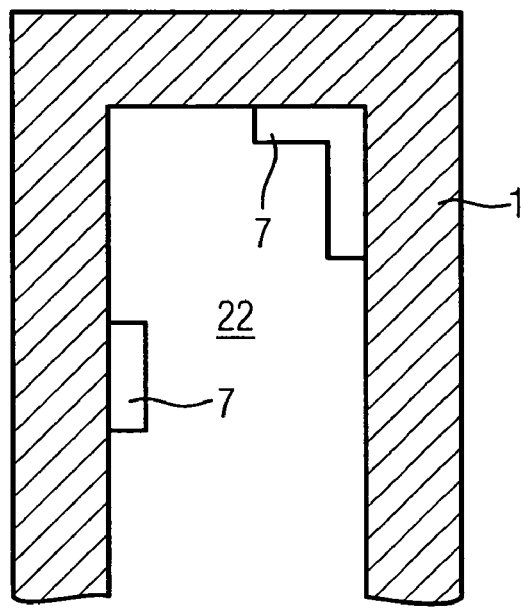
FIG. 4 shows an exemplary embodiment for the use of the process according to the invention.

FIG. 4 shows a further example of an application for the process according to the invention.

The component 1, 120, 130, 153, 155 (FIGS. 9, 10) may also have a cavity 22 in which a masking 7 is applied. The process is therefore suitable not only for outer surfaces but also for inner surfaces.

Figure 5:
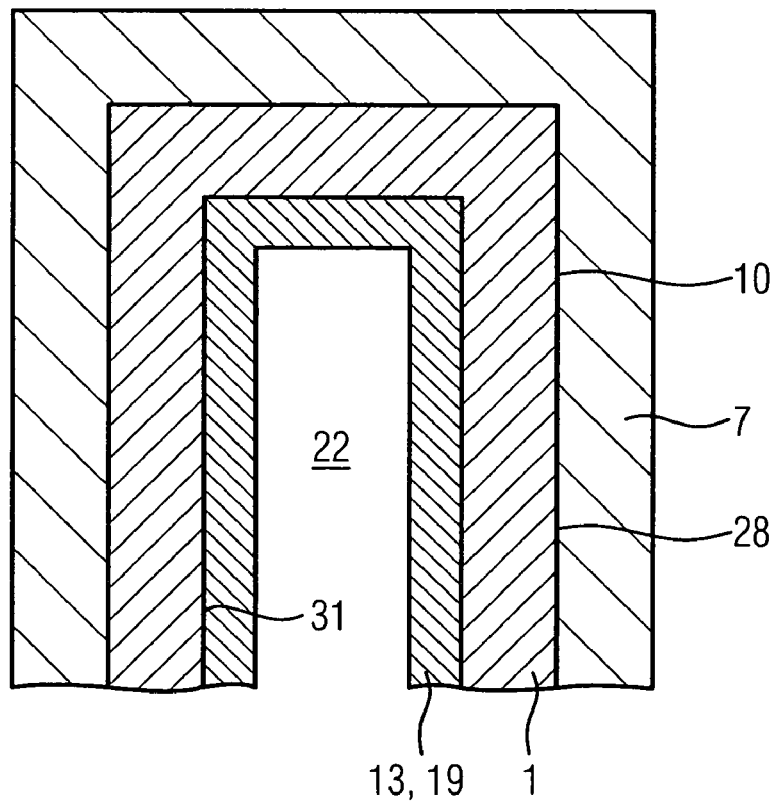
FIG. 5 shows a further exemplary embodiment for the use of the process according to the invention.

FIG. 5 shows a further example of an application for the process according to the invention.

In the case of the component 1, 120, 130, 153, 155 (FIGS. 9, 10), coating 13 is to take place in the cavity 22 of the component 1, 120, 130, 153, 155.

In this case, coating of an outer surface 28, 406 (FIG. 9) of the component 1, 120, 130, 153, 155 is not desired, and consequently a masking 7 is applied to the outer surface 28, 406 (for example the main blade part of a turbine blade or vane) of the component 1, 120, 130, 153, 155.

This means that the entire component 1, 120, 130, 153, 155 with the masking 7 can be introduced into the coating process without coating 13 taking place in the region 10 in which a coating is not desired, but rather taking place only in the desired regions 25 on an inner surface 31 of the component 1, 120, 130, 153, 155.

If necessary, however, the inner surface 31 can also be protected by a masking 7 at certain desired locations.

This is particularly useful for the internal alitizing of turbine blades or vanes for a gas turbine.

The coating temperature is in this case approximately 1080° C. and the coating is carried out, for example, in a hydrogen atmosphere.

The process and/or a masking 7 of this type can be used for newly produced components and/or components which are to be refurbished.

Refurbishment means that newly produced components which have defects or components which have been used are tested for defects, such as for example cracks, when are then filled. In the case of components 1, 120, 130, 153, 155 which have been used, corrosion products are also removed. This allows a component 1, 120, 130, 153, 155 of this type to be reused; before it can be reused, metallic and/or ceramic protective layers still have to be applied. This involves the use of the masking 7 in accordance with the present application.

The forgoing described method for protecting regions of the surface of a component which should not be coated can also be used for protecting the surface of a component in which holes are to be drilled by an energy beam like a laser beam. In this case, not only the regions which are not to be drilled can be coated with a powder layer, but also the entire surface necessary to be protected. For the powder layer, the powder as described above for the masking 7 can be used in order to protect the surface against molten material. Hence, this powder layer can easily be removed together with this material as described above, too.

The method is also useful in protecting ceramic, especially porous ceramic coating during laser oder e-beam drilling.

Figure 10:
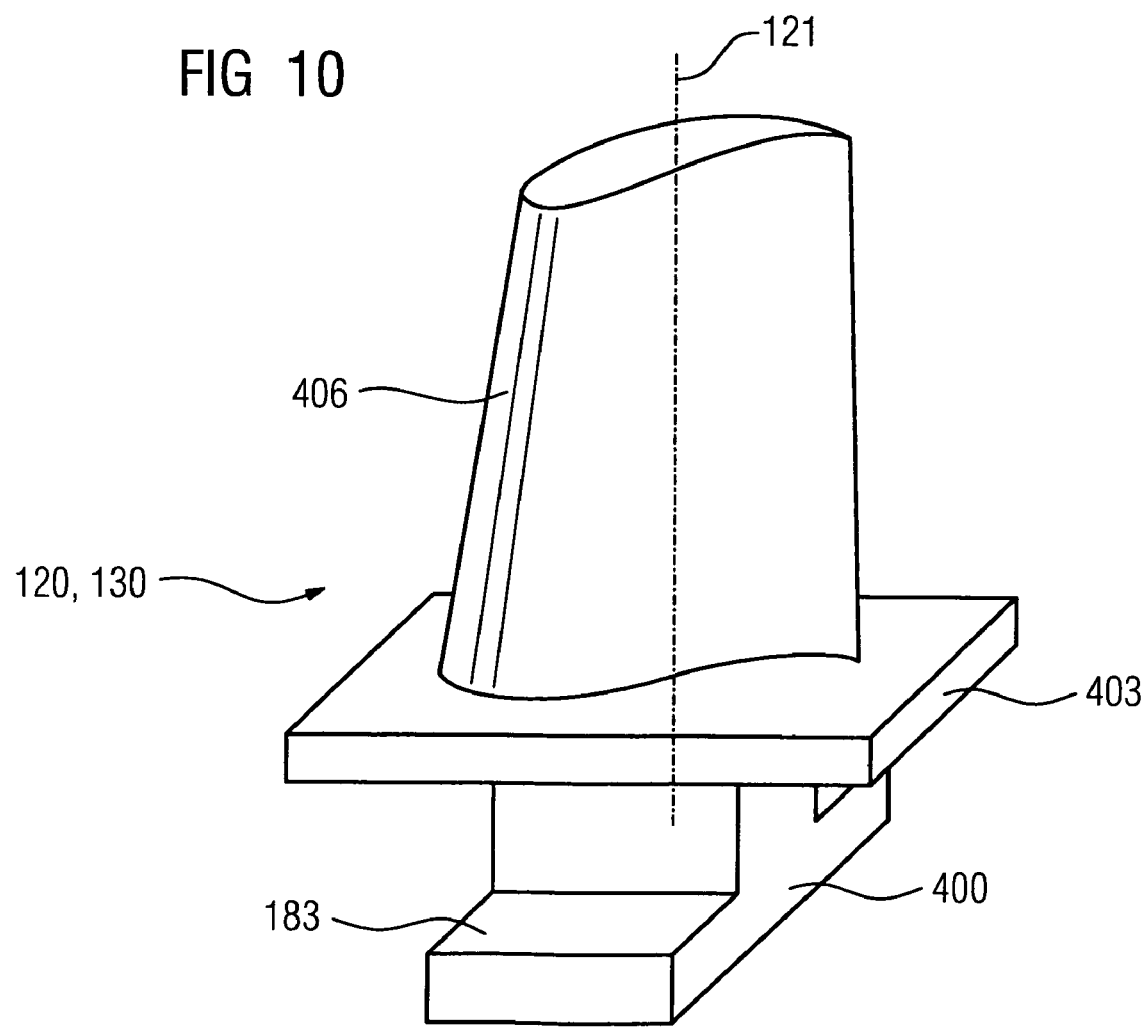

FIG. 10 shows a perspective view of a blade or vane 120, 130 which extends along a longitudinal axis 121. Along the longitudinal axis 121, the blade or vane 120, 130 has, in succession, a securing region 400, an adjoining blade or vane platform 403 and a main blade region 406. A blade root 183 which is used to secure the rotor blades 120, 130 to the shaft is formed in the securing region 400. The blade or vane root 183 is designed as a hammer head. Other configurations, for example as a fir-tree root or a dovetail root, are possible. In the case of conventional blades or vanes 120, 130, solid metallic materials are used in all regions 400, 403, 406 of the rotor blade 120, 130. The rotor blade 120, 130 may in this case be produced using a casting process, a forging process, a milling process or a combination thereof.

Figure 11:
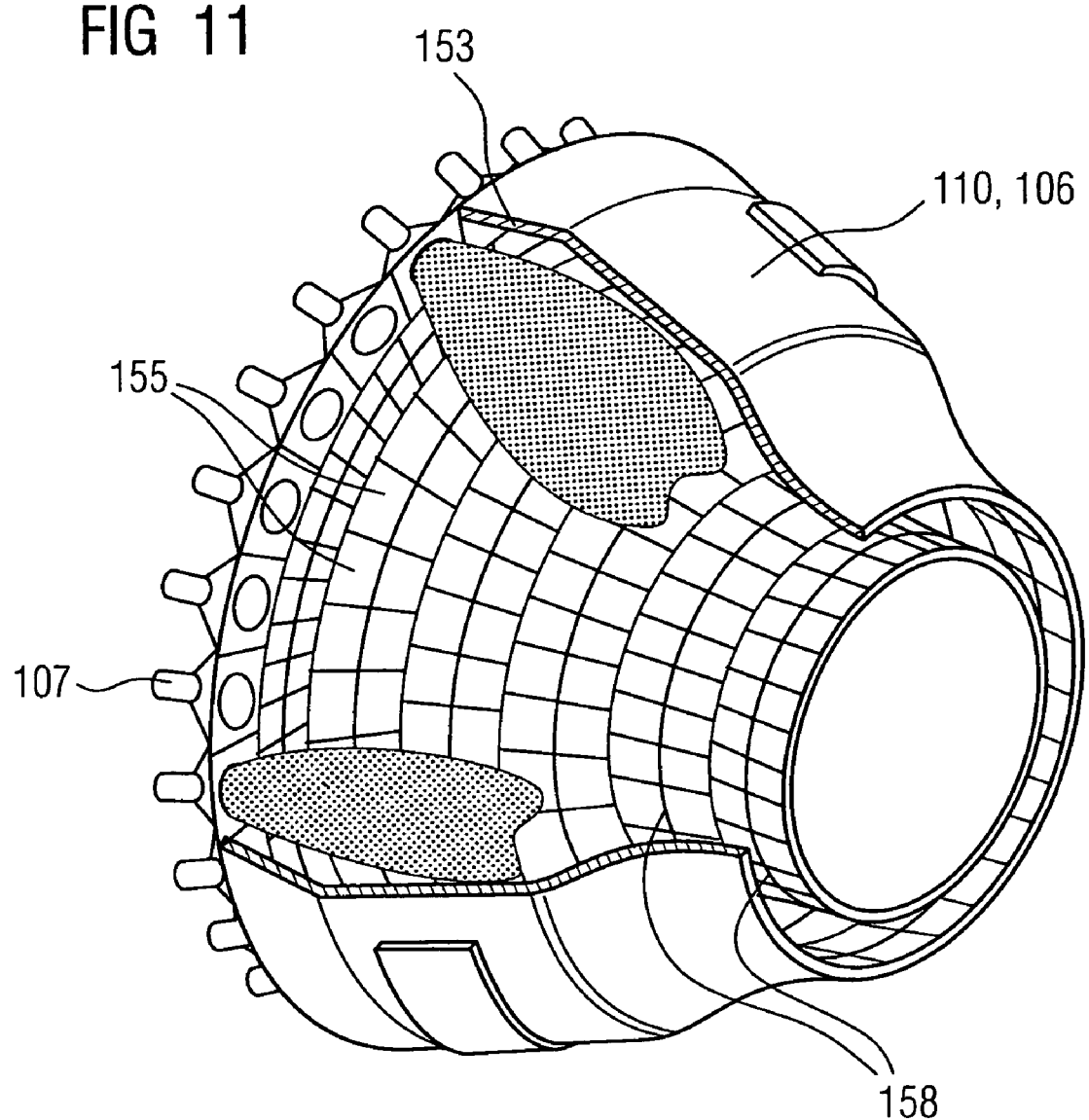
FIG. 11 shows an other component in accordance with the invention.

FIG. 11 shows a combustion chamber 110 of a gas turbine. The combustion chamber 110 is designed, for example, as what is known as an annular combustion chamber, in which a multiplicity of burners 102 arranged around the turbine shaft 103 in the circumferential direction open out into a common burner chamber space. For this purpose, the overall combustion chamber 110 is configured as an annular structure which is positioned around the turbine shaft 103.

To achieve a relatively high efficiency, the combustion chamber 110 is designed for a relatively high temperature of the working medium M of approximately 1000° C. to 1600° C. To allow a relatively long service life to be achieved with these operating parameters, which are unfavourable for the materials, the combustion chamber wall 153 is provided, on its side facing the working medium M, with an inner lining formed from heat shield elements 155. On the working medium side, each heat shield element 155 is equipped with a particularly heat-resistant protective layer or is made from material which is able to withstand high temperatures. Moreover, on account of the high temperatures in the interior of the combustion chamber 110, a cooling system is provided for the heat shield elements 155 and/or their holding elements.

The materials used for the combustion chamber wall and its coatings may be similar to the turbine blades or vanes 120, 130.

The combustion chamber 110 is designed in particular to detect losses of the heat shield elements 155. For this purpose, a number of temperature sensors 158 are positioned between the combustion chamber wall 153 and the heat shield elements 155.

Figure 12:
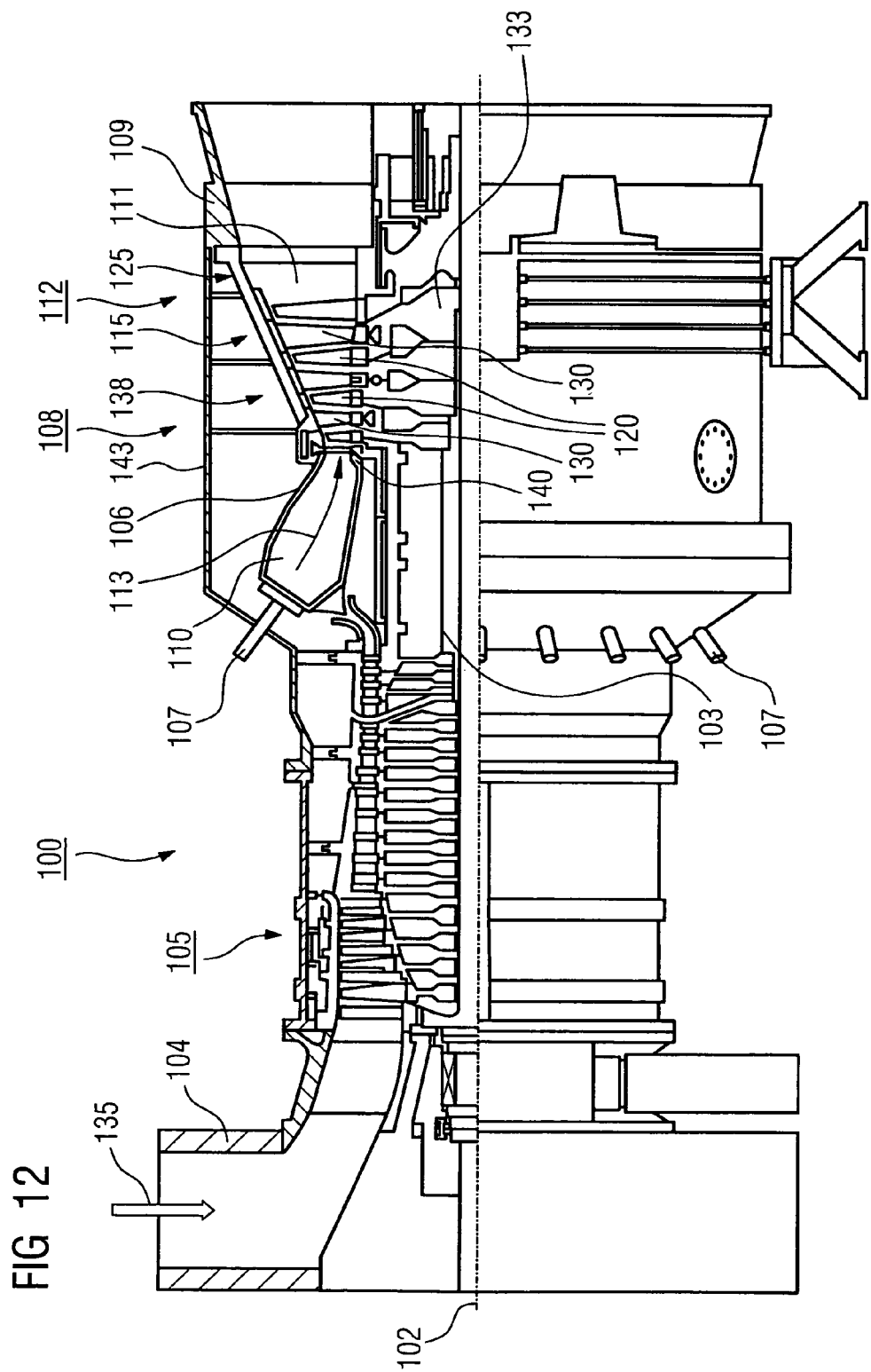
FIG. 12 shows a further component in accordance with the invention.

FIG. 12 shows, by way of example, a gas turbine 100 in partial longitudinal section.

In the interior, the gas turbine 100 has a rotor 103 which is mounted such that it can rotate about an axis of rotation 102.

An intake housing 104, a compressor 105, a, for example torus-like combustion chamber 110, in particular an annular combustion chamber 106, having a plurality of coaxially arranged burners 107, a turbine 108 and the exhaust-gas housing 109 follow one another along the rotor 103.

The annular combustion chamber 106 is in communication with an, for example annular, hot-gas passage 111, where, for example, four turbine stages 112 connected in series form the turbine 108.

Each turbine stage 112 is formed from two rings of blades or vanes. As seen in the direction of flow of a working medium 113, a row 125 formed from rotor blades 120 follows a row 115 of guide vanes in the hot-gas passage 111.

The guide vanes 103 are in this case secured to an inner housing 138 of a stator 143, whereas the rotor blades 120 of a row 125 are arranged on the rotor 103 by way of example by means of a turbine disk 133. A generator or machine (not shown) is coupled to the rotor 103.

While the gas turbine 100 is operating, the compressor 105 sucks in air 135 through the intake housing 104 and compresses it. The compressed air provided at the turbine-side end of the compressor 105 is passed to the burners 107, where it is mixed with a fuel. The mixture is then burnt in the combustion chamber 110, forming the working medium 113.

From there, the working medium 113 flows along the hot-gas passage 111 past the guide vanes 130 and the rotor blades 120. The working medium 113 expands at the rotor blades 120, transmitting its momentum, so that the rotor blades 120 drive the rotor 130 and the latter drives the machine coupled to it.

While the gas turbine 100 is operating, the components exposed to the hot working medium 113 are subject to thermal loads. The guide vanes 130 and rotor blades 120 belonging to the first turbine stage 112, as seen in the direction of flow of the working medium 113, are subject to the highest thermal loads apart from the heat shield blocks which line the annular combustion chamber 106.

To enable them to withstand the prevailing temperatures, they are cooled by means of a coolant.

The substrates may also have a directional structure, i.e. they are in single-crystal form (SX structure) or comprise only longitudinally directed grains (DS structure).

Iron-base, nickel-base or cobalt-base superalloys are used as the material.

By way of example, superalloys as known from EP 1204776, EP 1306454, EP 1319729, WO 99/67435 or WO 00/44949 are used; these documents form part of the present disclosure.

The blades or vanes 120, 130 may also have coatings protecting them from corrosion (MCrAlX; M is at least one element selected from the group consisting of iron (Fe), cobalt (Co), Nickel (Ni), X represents yttrium (Y) and/or silicon (Si) and/or at least one rare earth) and to protect against heat by means of a thermal barrier coating. The thermal barrier coating consists, for example, of $ZrO_2$, $Y_2O_4$—$ZrO_2$, i.e. it is not stabilized, is partially stabilized or is completely stabilized by yttrium oxide and/or calcium oxide and/or magnesium oxide.

Columnar grains are produced in the thermal barrier coating by suitable coating processes, such as electron beam physical vapor deposition (EB-PVD).

The guide vane 130 has a guide vane root (not shown here) facing the inner housing 138 of the turbine 108 and a guide vane head on the opposite side from the guide vane root. The guide vane head faces the rotor 103 and is fixed to a securing ring 140 of the stator 143.

The invention claimed is:

1. A coated component having a masking layer, comprising:
    a base component;
    a masking layer arranged on selected regions of a surface of the base component that are not to receive a coating, the masking layer consisting only of powder without a binder; and
    a coating arranged on selected regions of the base component that are to be coated, wherein
    the powder of the masking layer is substantially un-sintered and removable from the base component via water, and
    the powder of the masking layer includes powders with various grain size distributions, the grain sizes being between 0.2 μm and 40 μm.

2. A coated component having a protective layer, comprising:
    a component body;
    a coating layer arranged on the component body; and
    a protective layer arranged on selected regions of the coating layer which are not to be drilled during a drilling process, the protective layer comprising a powder, without a binder, wherein
    the layer is substantially un-sintered and removable from the coated component via water after drilling and without causing damage to the underlying coating layer of the coated component, and the powder of the protective layer includes powders with various grain size distributions, the grain sizes being between 0.2 μm and 40 μm.

3. The component as claimed in claim 2, wherein the protective layer is further applied to another selected regions of the surface of the component which are to be drilled.

4. A component as claimed in claim 2, wherein the protective layer consists only of powder.

5. The component as claimed in claim 2, wherein the powder is zirconium oxide or boron nitride.

6. The component as claimed in claim 2, wherein the protective layer has a thickness of 100 μm to 400 μm.

7. The component as claimed in claim 6, wherein the protective layer has a thickness of 180 μm to 200 μm.

8. The component as claimed in claim 2, wherein a mean grain size distribution of the powder has the following values of mean grain size distributions d10, d50, d90:

d10=0.2 μm–1 μm,
d50=1 μm–15 μm,
d90=15 μm–40 μm.

9. The component as claimed in claim 8, wherein the protective layer contains 10%-30% by weight of powder having a grain size distribution of d10, and the remainder of the protective layer contains 70%-90% by weight of powder with a greater grain size distribution than the selected distribution d10.

10. The component as claimed in claim 8, wherein the protective layer contains 10%-30% by weight of powder having a grain size distribution d50, and the remainder of the protective layer contains 70%-90% by weight of powder with a greater grain size distribution than the selected distribution d50.

* * * * *